United States Patent [19]
Kiehl

[11] Patent Number: 5,982,673
[45] Date of Patent: Nov. 9, 1999

[54] SECONDARY SENSE AMPLIFIER WITH WINDOW DISCRIMINATOR FOR SELF-TIMED OPERATION

[75] Inventor: Oliver Kiehl, Charlotte, Vt.

[73] Assignee: Siemens Aktiengesellschaft, Munich, Germany

[21] Appl. No.: 08/941,606

[22] Filed: Sep. 30, 1997

[51] Int. Cl.$^6$ .................................................. G11C 16/04
[52] U.S. Cl. .................. 365/189.01; 365/207; 365/191; 365/184; 365/196
[58] Field of Search .................................... 365/207, 205, 365/154, 189.01, 196, 191, 184

[56] References Cited

U.S. PATENT DOCUMENTS

| Re. 32,682 | 5/1988 | Eaton et al. | 365/189 |
|---|---|---|---|
| 4,716,550 | 12/1987 | Flannagan et al. | 365/207 |
| 5,491,667 | 2/1996 | Sharp | 365/205 |
| 5,525,919 | 6/1996 | Phelan | 327/52 |
| 5,528,542 | 6/1996 | Okamura | 365/205 |
| 5,528,543 | 6/1996 | Stiegler | 368/207 |
| 5,528,544 | 6/1996 | Kohno | 365/207 |
| 5,534,800 | 7/1996 | Hiraki et al. | 327/57 |
| 5,539,349 | 7/1996 | Roy | 327/276 |
| 5,544,110 | 8/1996 | Yuh | 365/205 |
| 5,546,026 | 8/1996 | Lin et al. | 327/54 |
| 5,566,116 | 10/1996 | Kang | 365/205 |
| 5,566,126 | 10/1996 | Yoshida | 365/190 |
| 5,627,787 | 5/1997 | Kalb Jr. | 365/205 |

Primary Examiner—David Nelms
Assistant Examiner—Thong Le
Attorney, Agent, or Firm—Stanton C. Braden

[57] ABSTRACT

A sensing system for sensing data from a data source and driving a pair of output lines in response thereto comprises: a primary sensing device operatively coupled to the data source for sensing and storing said data therein; and a secondary sensing device operatively coupled to the primary sensing device via a pair of input lines and also operatively coupled to the pair of output lines, the secondary sensing device being responsive to a differential voltage generated across the pair of input lines in accordance with said data stored by the primary sensing device and the secondary sensing device having a differential voltage threshold range associated therewith defined by a negative threshold and a positive threshold, whereby the secondary sensing device drives the pair of output lines to a first output condition when the differential voltage across the pair of input lines is within the differential voltage threshold range, to a second output condition when the differential voltage is at least equal to the negative threshold, and to a third output condition when the differential voltage is at least equal to the positive threshold.

25 Claims, 5 Drawing Sheets

SECONDARY SENSE AMPLIFIER WITH WINDOW DISCRIMINATOR FOR SELF-TIMED OPERATION

BACKGROUND OF THE INVENTION

1. Field of the Invention

The present invention relates generally to sense amplifiers and, more particularly, to secondary sense amplifier devices which include a window discriminator which enables the device to read data without the need for the device to be externally triggered.

2. Description of the Prior Art

Electronic memory devices such as Dynamic Random Access Memory (DRAM) devices or Static Random Access Memory (SRAM) devices are utilized in various electronic systems for storing large amounts of digitally encoded information. These devices typically include memory arrays which are utilized to store the digitally encoded information or data. The data is typically retrieved from such memory arrays by a device known as a sensing system.

Figure 1:
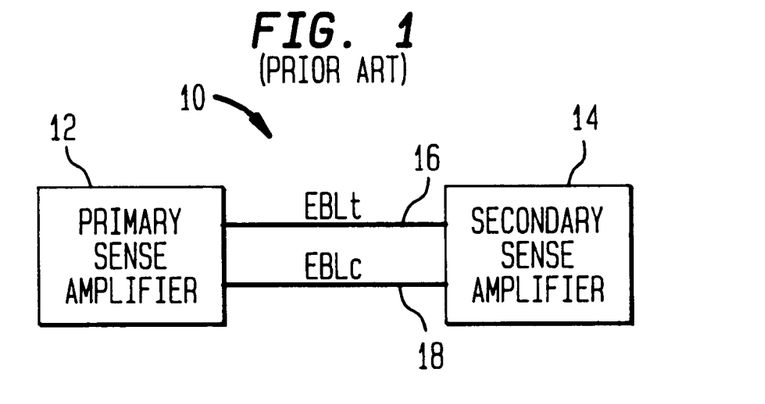
FIG. 1 is a block diagram of a conventional sense amplifier.

As shown in FIG. 1, a typical sensing system 10 in a DRAM device very often consists of a primary sense amplifier 12 and a secondary sense amplifier 14. The primary sense amplifier 12 is typically utilized to directly read data from the memory array, while the secondary sense amplifier 14 is typically utilized to read the data from the primary sense amplifier 12. This two part configuration is necessary in order to meet the high density requirements of DRAM devices. This is because DRAM devices contain a much larger number of primary sense amplifiers than secondary sense amplifiers, wherein these primary sense amplifiers are fabricated from transistors having a relatively small size which may be implemented in a high density array. Data is transferred between the sense amplifiers 12,14 through a pair of high capacitance lines respectively known as external bit line true (EBLt) 16 and external bit line complement (EBLc) 18.

During a read cycle, the primary sense amplifier 12 reads data from the memory array (not shown). The data is stored temporarily within the primary sense amplifier 12 by utilizing a latch. In order to transfer this stored data, the external bit lines 16,18 have to be pre-charged to a predetermined positive voltage before being coupled to the latch within the primary sense amplifier 12. The pre-charging is necessary in order to prevent the high capacitance external bit lines 16,18 from overriding the voltages stored within the primary sense amplifier 12. Such an overriding condition is possible because of the relative small size of the transistors utilized in the primary sense amplifier 12.

When the external bit lines 16,18 are then coupled to the latch within the primary sense amplifier 12, the voltage on one of the lines 16,18 drops below the pre-charge level which causes a differential voltage to develop. The respective condition associated with each of the external bit lines dropping below the pre-charge level ,thus providing two possible polarities of the differential voltage present across the external bit lines 16,18, represents the two logic states of the data stored in the primary sense amplifier 12. This differential voltage is then sensed by the secondary sense amplifier 14 in order to appropriately drive the read data lines (RDL). The data is read by another latch included in the secondary sense amplifier 14 which is set to one of the two possible logic states according to the polarity of the differential voltage.

Figure 2:
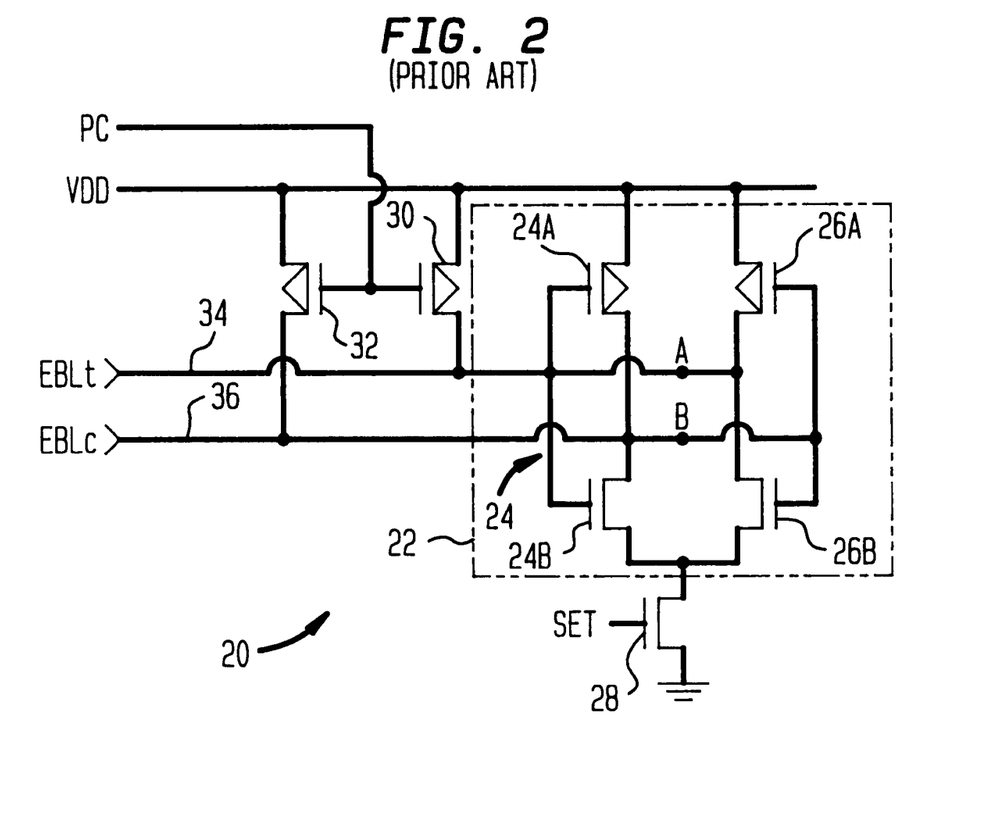
FIG. 2 is a schematic diagram of a conventional secondary sense amplifier.

Referring now to FIG. 2, an example of a conventional secondary sense amplifier is shown. The secondary sense amplifier 20 includes a latch 22 which includes a pair of cross-coupled inverters 24, 26. Each inverter 24, 26 includes a p-channel field effect transistor (FET) 24A and 26A and an n-channel FET 24B, 26B. The cross-coupling is accomplished by coupling the output of each inverter to the input of the other inverter. Nodes A and B are respectively formed at the junctions of the cross coupling. Such configuration enables the latch 22 to have two steady states, for instance, node A being a logic high and node B being a logic low, or vice versa. The latch 22 is considered to be in one of the two possible logic states when it is being driven towards either steady state condition. Nodes A and B of the latch 22 are respectively coupled to the external bit lines EBLt and EBLc at terminals 32, 34. As previously discussed, a differential voltage is developed across these external bit lines which subsequently determines the respective states of nodes A and B.

An n-channel FET 28 is coupled to the drains of the n-channel FETs 24B, 26B and is utilized to trigger the latch 22. The triggering transistor 28 is utilized to effectively isolate the latch 22 from the differential voltage developed across the external bit lines EBLt and EBLc for a predetermined amount of time. Such isolation is necessary in order to permit the differential voltage to reach a significant magnitude such that the differential voltage is capable of setting the latch 22 to one of its logic states. The necessary magnitude is typically about 200 millivolts (mV) which takes about 2 nanoseconds (nsec) to develop across the external bit lines which, themselves, each have a capacitance of about 2 picofarads (pF).

However, due to noise and offset considerations, the magnitude required to set the latch 22 is actually higher, for instance, in the range between about 200 to about 500 mV. For the differential voltage across the external bit lines to attain this magnitude, an additional 1 to 2 nsec is typically required. Thus, the triggering transistor 28 is turned on by a set signal about 3 to 4 nsec after the external bit lines are coupled to the primary sense amplifier, wherein about 1 to 2 nsec is a built-in margin to account for any noise or offsets. Accordingly, as is known, this 1 to 2 nsec serves as a safety guard band and also accounts for mismatch in column select line (CSL) drivetime, signal development time, as well as other timing mismatches known to occur in such devices.

Further, two pre-charge transistors 30, 32 are coupled between the inverter nodes A,B and voltage source VDD. These transistors 30, 32 are utilized to pre-charge the external bit lines (in response to the application of signal PC to their respective gate terminals), and thus the inverter nodes A,B, to the supply voltage VDD in order to prevent overriding, as previously discussed. The inverter nodes A,B are pre-charged in order to indicate to the rest of the memory device that the secondary sense amplifier does not contain data and thus enables the latch 22 to be driven to one of its logic states.

Figure 3:
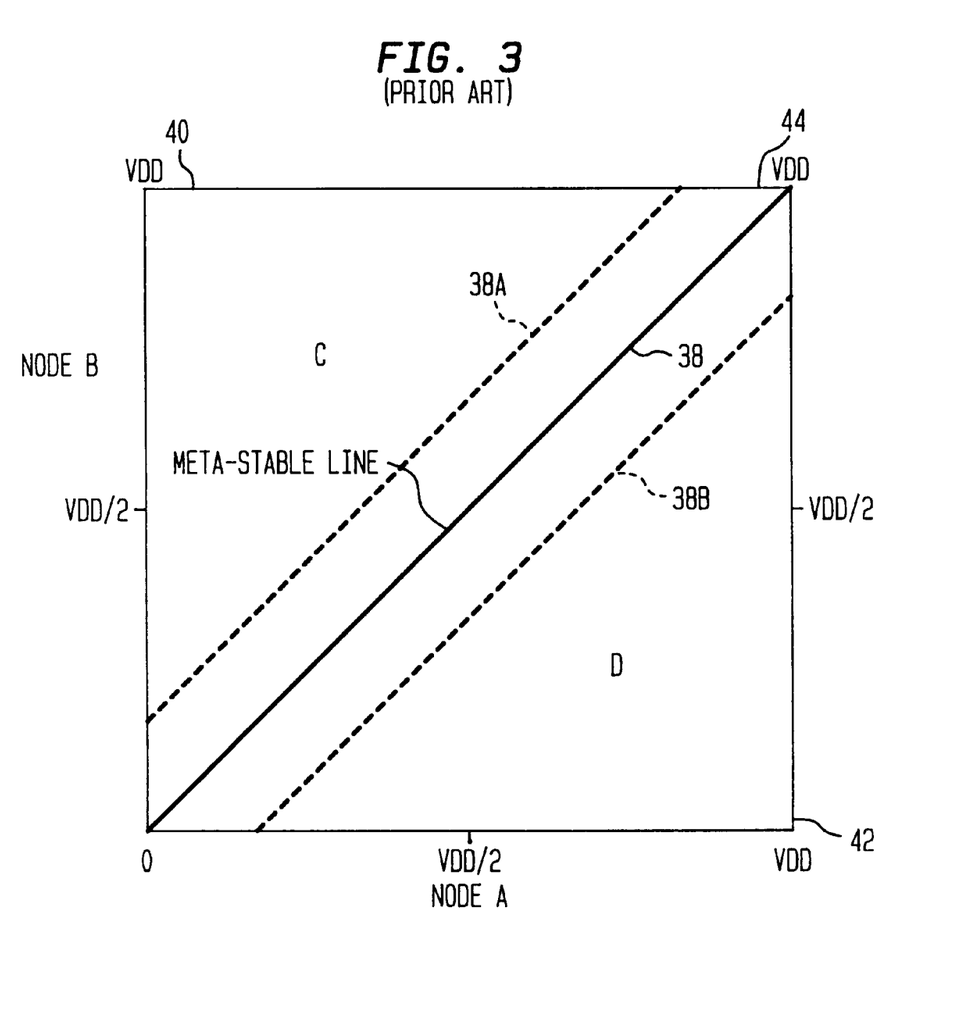
FIG. 3 is a diagram of the operational states of a latch included in a conventional secondary sense amplifier.

Referring now to FIG. 3, a diagram of the operational states of a typical latch, such as latch 22, included in a conventional secondary sense amplifier is shown. The x and y axis respectively represent the voltage levels of the inverter nodes A and B. A meta-stable line 38 represents the semi-stable states of the latch which include the pre-charge state 44, where nodes A and B equal VDD. Due to device irregularities, this meta-stable line may actually be located anywhere between the dashed lines 38A, 38B shown on either side of line 38. The previously discussed two stable states of the latch are designated by reference numerals 40 and 42.

The respective areas C and D between the meta-stable line 38 and the two stable states 40 and 42 represent the two possible logic states of the latch. As previously discussed in regard to FIG. 2, the latch is first driven into its pre-charge state by the PC signal turning on the pre-charge transistors 30, 32. Then, when a sufficient differential voltage is developed across the high capacitive external bit lines, the set signal turns on the triggering transistor 28. This causes the latch 22 to be driven towards one of its stable states 40 or 42, thereby setting the latch to one of its two possible logic states. In DRAM devices (particularly, asynchronous DRAM devices), the set signal is usually developed by an address transition detect (ATD) block.

The need for a conventional secondary sense amplifier, such as secondary sense amplifier 20, to be triggered by an external set signal has a number of disadvantages. First of all, a memory device utilizing such a scheme is larger in size since additional components are required to generate the set signal. Also, the power consumed by such a memory device is considerably higher. This is because the set signal utilized may need to be driven over a long signal line thus requiring the set signal to be a relatively large amplitude signal, which requires a considerable amount of power to generate. Also, such a memory device is inherently slower due to the built-in margin requirements discussed above.

SUMMARY OF THE INVENTION

It is therefore at least one object of the present invention to provide a device, such as a secondary sense amplifier device, coupled between a pair of input lines, such as external bit lines, and a pair of output lines, such as read data lines, for driving the pair of output lines in response to a differential voltage across the pair of input lines whereby the device does not require external triggering.

In one aspect of the invention, a sensing system for sensing data from a data source and driving a pair of output lines in response thereto comprises: a primary sensing device operatively coupled to the data source for sensing and storing said data therein; and a secondary sensing device operatively coupled to the primary sensing device via a pair of input lines and also operatively coupled to the pair of output lines, the secondary sensing device being responsive to a differential voltage generated across the pair of input lines in accordance with said data stored by the primary sensing device and the secondary sensing device having a differential voltage threshold range associated therewith defined by a negative threshold and a positive threshold, whereby the secondary sensing device drives the pair of output lines to a first output condition when the differential voltage across the pair of input lines is within the differential voltage threshold range, to a second output condition when the differential voltage is at least equal to the negative threshold, and to a third output condition when the differential voltage is at least equal to the positive threshold.

In another aspect of the invention, a device coupled between a pair of input lines and a pair of output lines for driving the pair of output lines in response to a differential voltage across the pair of input lines comprises: current source means; differential amplifier means having a pair of input terminals respectively operatively coupled to the input lines, a pair of output terminals respectively operatively coupled to the output lines, and another pair of terminals operatively coupled to the current source means, the differential amplifier means being responsive to the differential voltage across the pair of input lines and having a differential voltage threshold range associated therewith defined by a negative threshold and a positive threshold; and driver means for driving the pair of output lines, the driver means being operatively coupled between the current source means and the differential amplifier means, wherein the driver means drives the pair of output lines to a first output condition in response to the current source means and the differential amplifier means when the differential voltage across the input lines is within the differential voltage threshold range of the differential amplifier means, wherein the driver means drives the pair of output lines to a second output condition in response to the current source means and the differential amplifier means when the differential voltage across the input lines is at least equal to the negative threshold of the differential voltage threshold range, and wherein the driver means drives the pair of output lines to a third output condition in response to the current source means and the differential amplifier means when the differential voltage across the input lines is at least equal to the positive threshold of the differential voltage threshold range.

These and other objects, features and advantages of the present invention will become apparent from the following detailed description of illustrative embodiments thereof, which is to be read in connection with the accompanying drawings.

DETAILED DESCRIPTION OF THE INVENTION

The present invention is directed to a secondary sense amplifier used in an integrated circuit (IC). Such IC is, for example, a random access memory (RAM), such as a dynamic random access memory (DRAM), a synchronous DRAM (SDRAM), or a static RAM (SRAM). The IC may also be an application specific IC (ASIC), a merged DRAM-logic circuit (embedded DRAM), or any other logic circuit.

Typically, numerous ICs are formed on the wafer in parallel. After processing is finished, the wafer is diced to separate the ICs to individual chips. The chips are then packaged, resulting in a final product that is used in, for example, consumer products such as computer systems, cellular phones, personal digital assistants (PDAs), and other electronic products.

In accordance with the invention, the secondary sense amplifier does not require external triggering, but instead is advantageously self-timed. This is accomplished by constructing a secondary sense amplifier that is set up for sensing significantly before there is an adequate signal present on the external bit lines. A secondary sense amplifier formed in accordance with the present invention detects a differential voltage threshold in both a positive and negative direction across the external bit lines, between which the secondary sense amplifier device is nonactive. Such a window formed between the negative and positive thresholds is referred to hereinafter as a discriminator window, which will be described in detail later. Further, such a secondary sense amplifier is capable of accelerating internal signal propagation by utilizing various feedback methods, as will also be explained herein.

It is to be appreciated that the phrases "inactive state", "active ready state" and "active set state" used to describe the operation of the secondary sense amplifier device of the present invention have specific meanings. The device is considered to be in an inactive (i.e., nonactive) state when the external bit lines are in a precharged state, as will be explained. Further, the device is considered to be in an active ready state when the device is not yet set to one logic state and does not drive the read data lines (RDLs) but pre-charge is turned off already (i.e, the device is no longer held in inactive state), as will be explained. Lastly, the device is considered to be in an active set state when the device is set to one logic state and drives the read data lines (RDLs) in response thereto, as will be explained.

Figure 4:
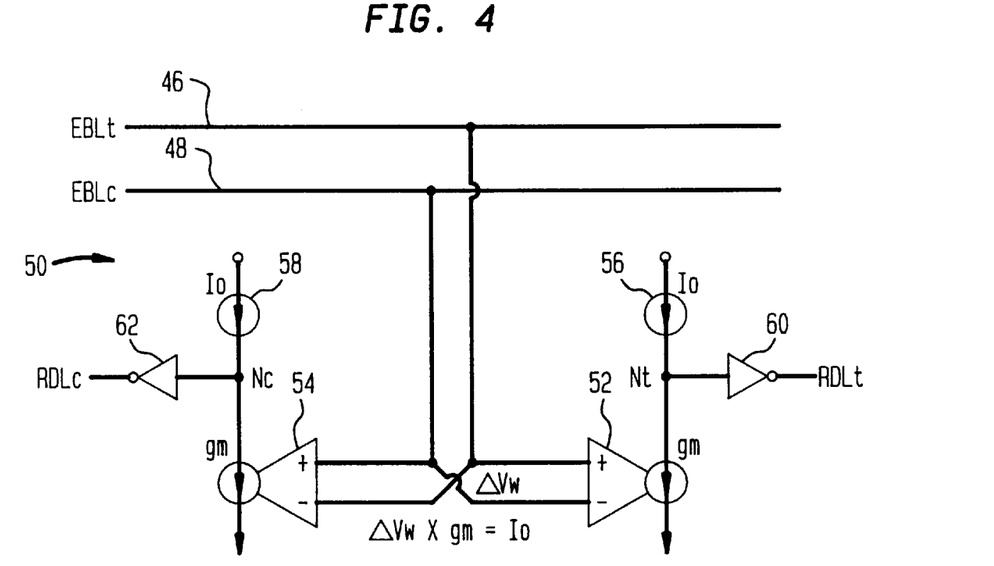
FIG. 4 is a functional schematic diagram for illustrating principles of a secondary sense amplifier utilizing a window discriminator according to the present invention.
Figure 5:
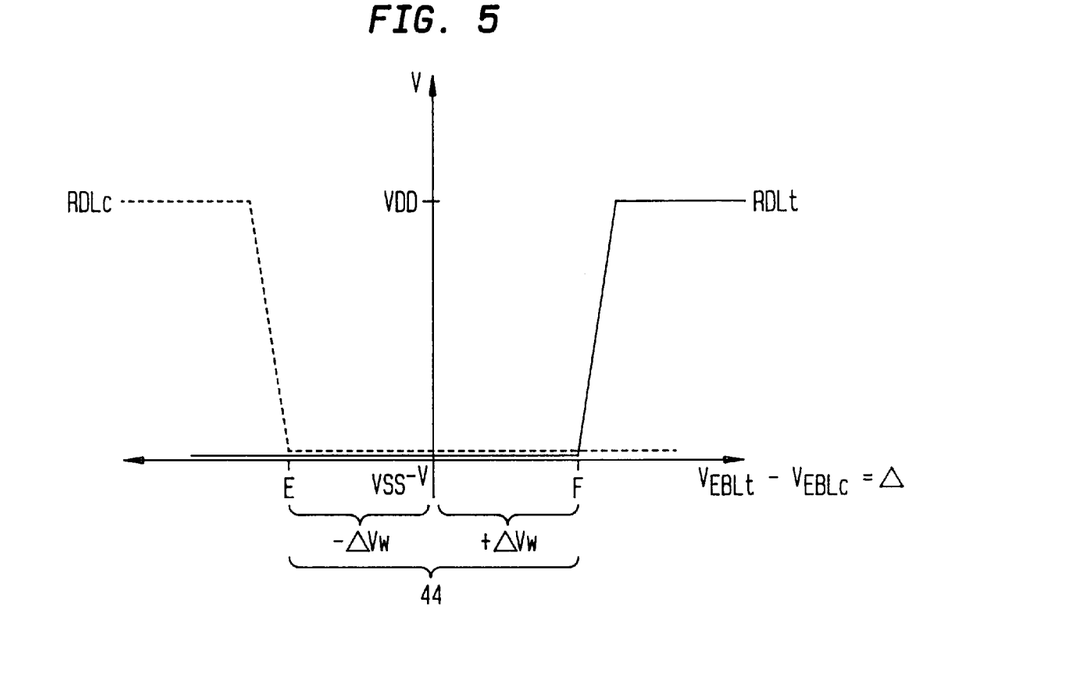
FIG. 5 is a diagram of the input-output characteristics of a secondary sense amplifier incorporating a window discriminator according to the present invention.

Referring now to FIGS. 4 and 5, a functional schematic diagram for illustrating the principles of the present invention (FIG. 4) and an exemplary graph of input-output characteristics associated with a device formed in accordance with the invention (FIG. 5) are shown. Referring first to FIG. 5, the input-output characteristics of a secondary sense amplifier incorporating a window discriminator according to the present invention are shown. Specifically, the x axis of the graph represents the input voltage to the secondary sense amplifier which is the differential voltage developed across the external bit lines, as previously discussed. The differential voltage is the difference between the voltage potential of the external bit line true, $V_{EBLt}$, and the voltage potential of the external bit line complement, $V_{EBLc}$, and is hereinafter referred to as DEBL. The y axis represents the voltage of the outputs of the secondary sense amplifier (ranging between voltages VSS and VDD) which are each coupled to a pair of read data lines referred to as RDLt (read data line true) and RDLc (read data line complement), wherein the solid line in the diagram represents the output of the secondary sense amplifier coupled to RDLt and the dashed line represents the output of the secondary sense amplifier coupled to RDLc.

Specifically, when the difference between $V_{EBLt}$ and $V_{EBLc}$ (i.e., DEBL) is within a discriminator window 44 (denoted also as +/−DVw), both read data lines RDLt (solid line) and RDLc (dashed line) are a logic low (VSS), as shown in FIG. 5. It is to be appreciated that while RDLt and RDLc are preferably at VSS within the window 44, the graphical lines (dashed and solid) respectively representing the data lines on the graph are slightly raised from the x axis and from each other merely for the sake of viewing clarity. It is to be understood that when DEBL is within such window 44, the secondary sense amplifier of the invention is considered to be in a tri-state condition. It is to be appreciated that a secondary sense amplifier according to the present invention in such a tri-state condition may be either in an inactive state or the active ready state, depending on the differential voltage. Nonetheless, the external bit lines do not yet contain valid data.

However, when DEBL increases (in either the positive or negative direction) so that the differential voltage between the external bit lines is not within the window 44, the secondary sense amplifier is now in the active set state, which causes one of the read data lines RDLt or RDLc to be driven to a logic high. The polarity of DEBL determines which one of the read data lines RDLt or RDLc is driven high thus determining the logic state of the device. For instance, when RDLt is driven high and RDLc remains low, this may, for example, correspond to a binary "1" being read from the addressed memory location, while on the other hand, when RDLt remains low and RDLc is driven high, this may, for example, correspond to a binary "0" being read from the addressed memory location. It is to be appreciated that the input-output characteristics shown in FIG. 5 may be inverted if an opposite logic convention were employed, e.g., RDLt and RDLc being high during tri-state condition and low when respectively driven.

The width of the discriminator window 44, defined between points E and F on the x axis, is determined by the electrical characteristics of the components that implement the window discriminator. For instance, it is possible to choose component sizing that provides a window having a width of about 400 mV (i.e., E at about −200 mV to F at about +200 mV). This means that the secondary sense amplifier according to the present invention can be activated by a DEBL having a magnitude as low as about 200 mV. This is desirable because it takes less time for the external bit lines to reach such a voltage difference. As previously described, conventional sense amplifiers typically include a margin to account for parameter variations, which causes such devices to only be activated at a higher differential voltage. Therefore, by utilizing a window discriminator as provided by the present invention and as illustrated in FIG. 5, the performance of a secondary sense amplifier, so formed, is significantly improved.

Referring now to FIG. 4, a functional schematic diagram for illustrating principles of a secondary sense amplifier of the invention is shown. The secondary sense amplifier 50 includes a pair of differential transconductance amplifiers 52, 54, wherein each amplifier 52,54 has a noninverting and inverting input terminal. The noninverting terminal of amplifier 52 is coupled to the inverting terminal of amplifier 54 and both terminals are coupled to the external bit line true EBLt 46. Further, the noninverting terminal of amplifier 54 is coupled to the inverting terminal of amplifier 52 and both terminals are coupled to the external bit line complement EBLc 48.

The amplifiers 52,54 are utilized to generate a current proportional to the differential voltage developed across the external bit lines 46, 48, which is represented by DEBL. The current generated by the amplifiers 52, 54 may be calculated from the following equation:

$$I = gm \times DEBL \qquad (1)$$

where gm is the transconductance or current gain of the amplifiers 52, 54. As mentioned, the inverting and noninverting inputs of each amplifier 52, 54 are coupled to the external bit lines 46, 48 in crossed order to account for the two different logic levels of the data sent over the external bit lines 46,48. Thus, for each logic state, only one of the amplifiers 52, 54 is conducting current.

The outputs of each amplifier 52, 54 are respectively coupled to an associated current source 56, 58 forming nodes Nt and Nc. Each of the current sources 56, 58 provide an identical current $I_0$ which is utilized as a reference in the circuit. Further, respectively coupled to each of the nodes Nt and Nc are inverting drivers 60, 62. The outputs of the drivers 60, 62 form the outputs of the secondary sense amplifier 50 which are respectively coupled to a pair of read data lines RDLt and RDLc. The inverting drivers 60, 62 drive RDLt and RDLc into the different logic states in response to the current sources 56, 58 and the amplifiers 52, 54, as will be explained.

At the start of a read cycle, the external bit lines 46, 48 are both high (e.g., VDD) due to pre-charging. This causes DEBL to be equal to about zero (i.e, in middle of discriminator window 44, that is, equidistant between points E and F in FIG. 5) which means both amplifiers 52, 54 are turned on but generating a current of about 0 mA (i.e., current is proportional to the differential voltage DEBL). Nodes Nc, Nt are respectively pulled up to a high potential by the current sources 56, 58 conducting from VDD. This holds the read lines RDLt and RDLc at a low potential due to the inverting operation of drivers 60, 62. As previously discussed, both lines RDLt and RDLc being held low corresponds to a tri-state condition, which indicates that the secondary sense amplifier 50 has not yet set and thus does not contain any valid data.

When data is sent over (available on) the external bit lines 46, 48, the voltage on one of the bit lines begins to drop. This causes the DEBL to move away from the center of the window 44 toward either point E or F depending upon which external bit line drops. For example, if EBLt 46 begins to drop below the pre-charge level (VDD), given the arrangement shown in FIG. 4, the left amplifier 54 begins to generate a positive current. When the magnitude of DEBL rises to a predetermined value (threshold) which may be, for example, about 200 mV, the current generated by this amplifier 54 equals or exceeds the current $I_0$ provided by the left current source 58. This causes the left node Nc to be pulled to a low potential. It is to be appreciated that ideally the transition in potential at node Nc is instantaneous; however, due to non-infinite output conductance of the current sources, the transition is not infinitely steep. As a result, as shown in FIG. 5, the slope of the lines illustrating RDLt and RDLc transitioning from VSS to VDD is relatively steep but not vertical, as would be the case using ideal components. FIG. 4 illustrates more of an ideal component implementation of the present invention, while FIGS. 6 and 7, as will be explained, illustrate some exemplary real component implementations.

At this point, the secondary sense amplifier 50 recognizes a valid logic state on the external bit lines 46, 48, which is the self timing aspect of the present invention. As previously discussed, conventional secondary sense amplifiers rely on an external trigger signal to accomplish this function.

When Nc is pulled low, RDLc is driven high by the left inverting driver 62. Thus, the secondary sense amplifier 50 is in one of its two logic states since the left output RDLc is high, while the right output RDLt is still low. It is to be appreciated that when EBLc 48 is the external bit line that drops below the pre-charge level, the right side of the secondary sense amplifier 50 operates similarly as described above to drive the outputs RDLt, RDLc to the other logic state. That is, Nt is pulled low and, as a result, RDLt is driven high by right inverting driver 60.

The secondary sense amplifier 50 according to the present invention can be designed to recognize various predetermined DEBL values. This is accomplished by selecting values for $I_0$ and gm according to the following equation in order to set the positive threshold (+DVw) and negative threshold of (−DVw) the window 44:

$$½DVw½ = I_0 /gm \quad (2)$$

where ½DVw½ is the absolute value or half of the width of the discriminator window 44 (FIG. 5).

It is to be appreciated that the functional schematic diagram of FIG. 4 illustrates only one method of implementing the window discriminator according to the present invention. Accordingly, other types of differential amplifier arrangements may be used to implement the principles of the present invention described herein. For instance, the text by P. R. Gray and R. G. Meyer, "Analysis and Design of Analog Integrated Circuits", 3rd edition, Wiley & Sons (1993), provides many examples of differential amplifier circuits which may be employed. Those of ordinary skill in the art will appreciate many other implementations.

Figure 6:
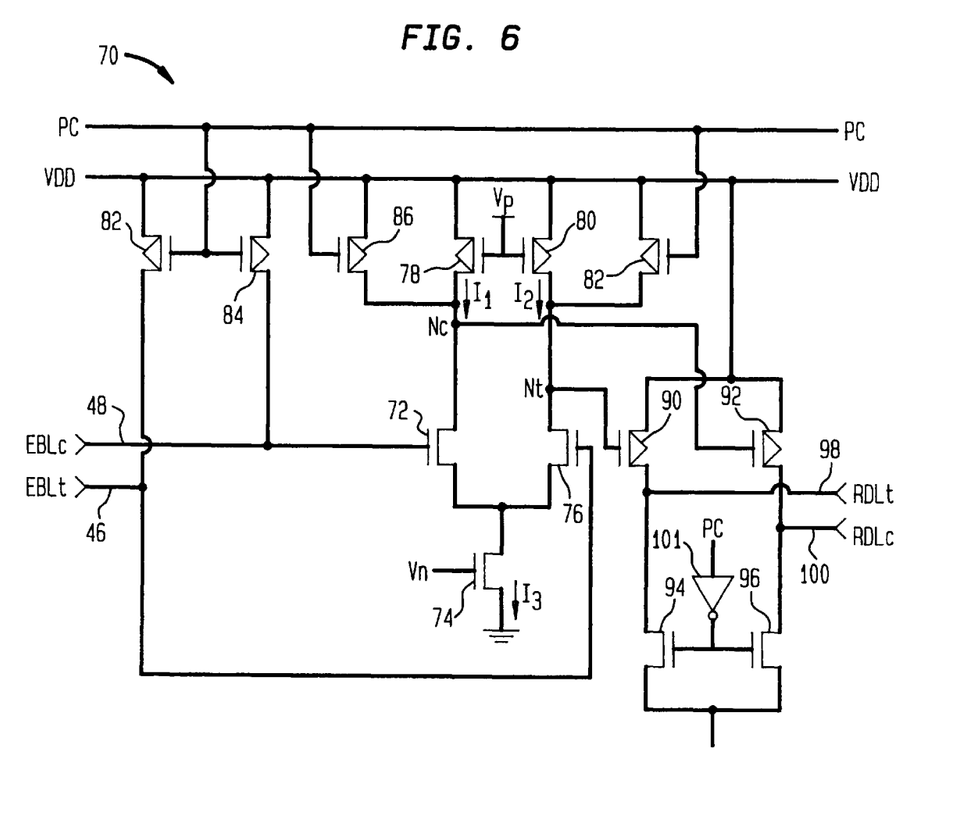
FIG. 6 is a schematic diagram of one implementation of a secondary sense amplifier according to the present invention.

Referring now to FIG. 6, a schematic diagram of one implementation of a secondary sense amplifier 70 utilizing a window discriminator according to the present invention is shown. The secondary sense amplifier 70 shown in FIG. 6 represents one embodiment of an actual circuit implementation of the functional schematic diagram of FIG. 4. Thus, the transistors designated by reference numerals 72, 74 and 76 correspond to the transconductance amplifiers 52, 54 of FIG. 4, the transistors designated by reference numerals 78 and 80 correspond to the associated current sources 56, 58 of FIG. 4, and the transistors designated by reference numerals 90 and 92 correspond to the associated drivers 60, 62 of FIG. 4.

Specifically, a differential amplifier is formed by a pair of source coupled n-channel FET devices 72 and 76. Nodes Nc and Nt are respectively formed at the outputs of the differential amplifier 72, 76 and have a current flowing therethrough which is 180 degrees out of phase with the other. The gate terminals of these devices 72, 76 are respectively coupled to the external bit lines EBLc 48 and EBLt 46. These devices 72, 76 are utilized to amplify the differential voltage developed across the external bit lines EBLt and EBLc. Further, another n-channel FET device 74 is coupled between the source terminals of the devices 72, 76 and ground. Coupled to the gate terminal of the device 74 is a predetermined voltage potential Vn which serves as a bias voltage for the n-channel transistor and which acts as current source.

An example of the current flow through the circuit will be given; however, it is to be appreciated that the values used in the following example are chosen for exemplary purposes and, rather, the preferred range of operation may be between about 10 mA and about 10 mA. Accordingly, for exemplary purposes, it is to be assumed that the device 74 has a saturation current of about 1 mA.

Coupled between nodes Nc and Nt and the voltage source VDD is a pair of p-channel FET devices 78 and 80 which respectively serve as current sources. The gate terminals of these transistors 78, 80 are both coupled to a second predetermined potential Vp which serves as a bias voltage for the p-channel transistors and, depending on its value, keeps the device either in the active or saturation region of operation. For the sake of the example, these devices 78, 80 are chosen to both have a saturation current of about 0.75 mA.

Also respectively coupled to nodes Nt and Nc are p-channel FET devices 90 and 92 which serve as drivers. While the gate terminals of these devices 90, 92 are respectively coupled to nodes Nt and Nc, and the source terminals are coupled to VDD, the drain terminals are respectively coupled to a pair of read data lines RDLt 98 and RDLc 100.

Still further, respectively coupled between the voltage source VDD and the external bit lines (EBLt 46 and EBLc 48), the read data lines (RDLt 98 and RDLc 100) and nodes Nc and Nt are additional p-channel FET devices 82, 84, 86 and 88 which are utilized to pre-charge these points to the pre-charge level of VDD in order to prepare the secondary sense amplifier 70 to receive data. The gate terminals of these devices 82, 84, 86 and 88 are each coupled to a PC (pre-charge) signal line which carries the signal PC which controls the pre-charging step. In addition, respectively coupled between a ground potential and the read data lines (RDLt 98 and RDLc 100) are n-channel FET devices 94 and 96 which are utilized to pre-charge RDLt and RDLc to ground. The gate terminals of devices 94, 96 are coupled to line PC (pre-charge) through inverter 101.

At the start of a read cycle, the signal PC goes low which turns on the pre-charging devices 82, 84, 86 and 88. Inverter 101 inverts the PC signal which causes devices 94 and 96 to also turn on. Signal PC going low causes the external bit lines (EBLt 46 and EBLc 48) and nodes Nc and Nt to be pre-charged to VDD and the read data lines (RDLt 98 and RDLc 100) to be pre-charged to ground. The external bit lines (EBLt 46 and EBLc 48) and the read data lines (RDLt 98 and RDLc 100) are pre-charged to VDD and ground, respectively, to prevent overriding, while the nodes Nc and Nt are pre-charged to VDD to ensure that the secondary sense amplifier 70 is in the tri-state condition before receiving data.

After the PC signal goes back high again, the secondary sense amplifier 70 still remains in the tri-state condition. In this condition, the associated current sources 78, 80 are in the active region of operation producing preferably identical currents $I_1$ and $I_2$ having an exemplary value of about 0.5 mA each. The currents $I_1$ and $I_2$ flow through the differential amplifier devices 72, 76 to the source coupled device 74. The differential amplifier devices 72, 76 are also both turned on due to the external bit lines (EBLt 46 and EBLc 48) being pre-charged to VDD. Transistor device 74 is in the saturation region of operation which preferably sinks 13 which is about 1 mA, i.e., the sum of $I_1$ and $I_2$.

It is to be appreciated that in the active ready state and the pre-charge (inactive) state, current sources 78 and 80 pull about 750 mA each and, as a result, nodes Nc and Nt are at about VDD. When data is sent over the external bit lines, the voltage on one of the external bit lines begins to drop which again develops a differential voltage across the external bit lines. In turn, the left amplifier device 72 begins to conduct less current, which causes the current $I_1$ to decrease. At the same time, the current $I_2$ begins to increase in order to maintain the constant current $I_3$ at about 1 mA. Because current source 80 still delivers about 750 mA, node Nt remains close to VDD.

When the differential voltage across the external bit lines reaches a predetermined level (Vw), the left amplifier 72 delivers a reduced current of about 250 mA and the node Nc remains near or at VDD. At the same time, the right current source 80 begins to operate in the saturation region providing an $I_2$ current of about 750 mA, which enables node Nt to remain substantially high. Transistor device 74, which is now operating in the saturation region, sinks the entire 750 mA. As the differential voltage on the external bit lines exceeds Vw, then the amplifier 76 delivers more than 750 mA (thus, overcoming the 750 mA that can be delivered by current source 80) and, as a result, node Nt is pulled towards ground. The node Nt being near or at ground potential causes the associated driver 90 to be turned on. This causes the read data line RDLt 98 to be driven high, while the read data line RDLc 100 remains low. This condition on the read data lines corresponds to one of the two logic states of the device 70. Thus, the data detected over the external bit lines by the secondary sense amplifier 70 is sensed, amplified and then transferred to the read data lines RDLt and RDLc.

It is to be appreciated that the above sequence of operations is similar for driving the read data lines to the opposite logic state when the opposite external bit line drops and the other remains high. This causes the read data line RDLc 100 to be driven high, while the read data line RDLt remains low which corresponds to the other logic state of the device 70. One of ordinary skill in the art will appreciate the specific sequence of operations for generating this logic state given the previously described sequence. Again referring to FIG. 5, it is to be understood that the period during which the secondary sense amplifier 70 is in the tri-state condition corresponds to the situation when the differential voltage across the external bit lines, DEBL, is within the discriminator window 44.

Figure 7:
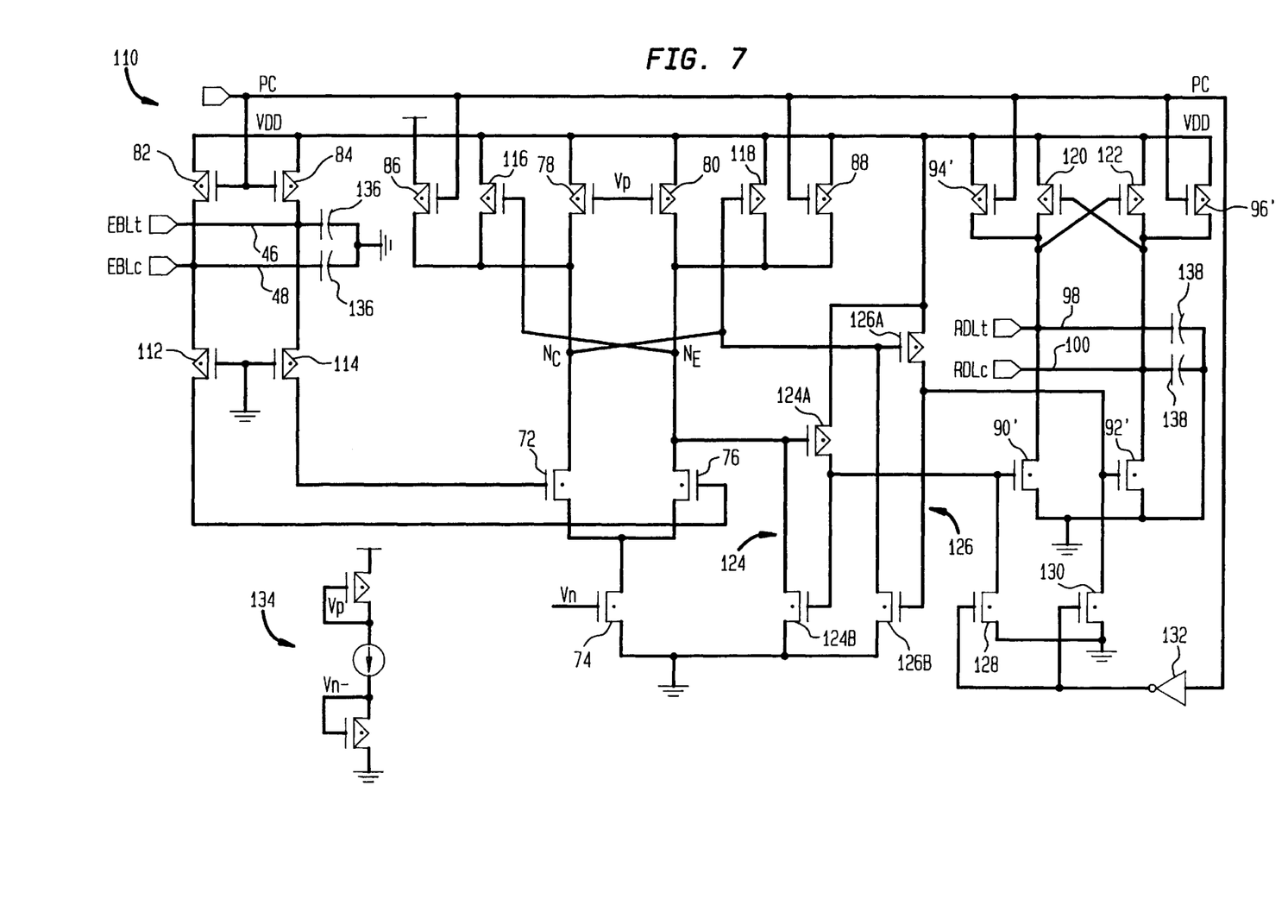
FIG. 7 is a schematic diagram of another implementation of a secondary sense amplifier according to the present invention.

Referring now to FIG. 7, a schematic diagram of another embodiment of a secondary sense amplifier 110 utilizing a window discriminator according to the present invention is shown. This embodiment of the secondary sense amplifier 110 operates and includes similar devices which are designated by the same reference numerals as described above in regard to the embodiment of FIG. 6. Drivers 90¢ and 92¢, are similar in function to drivers 90 and 92 in FIG. 6; however, the drivers 90¢ and 92¢ are n-channel FET devices, as opposed to p-channel FET devices. Also, devices 94¢ and 96¢ are similar in function to devices 94 and 96 in FIG. 6; however, devices 94¢ and 96¢ are p-channel FET devices, as opposed to n-channel FET devices. For this reason, it is to be appreciated that while the embodiment shown in FIG. 7 operates similarly to the embodiment of FIG. 6 (with the exception of the additional devices and features to be explained below), due to opposite logic used to implement portions of the latter embodiment, the input-output characteristics (RDLt and RDLc versus DEBL) are inverted in the latter embodiment, as compared to the former embodiment. Thus, a graph similar to FIG. 5 for the embodiment of FIG. 7 would simply be inverted, i.e., RDLt and RDLc being at about VDD within the window 44 and respectively dropping to about VSS outside the window 44.

However, as mentioned above, the secondary sense amplifier 110 includes additional devices that perform functions that further enhance the operation of the present invention. Since this embodiment operates similarly as described in regard to FIG. 6, only the additional devices will be described.

The secondary sense amplifier 110 includes a pair of pass transistors 112 and 114 which are both p-channel FET devices and are respectively coupled between the external bit lines EBLt 46 and EBLc 48 and the gate terminals of the differential amplifier devices 72, 76. The pass transistors 112, 114 are utilized to isolate the differential amplifiers 72, 76 from the external bit lines EBLt and EBLc. Such selective isolation is advantageous in a variety of applications. For example, in an application where the secondary sense amplifier of the invention is being used with more than one external bit line pair, e.g., in a decoding application, selective isolation between the amplifier and the external bit lines is useful. One of ordinary skill in the art will contemplate other applications for such isolation.

Further, coupled between nodes Nc and Nt and the voltage source VDD are latching devices 116 and 118 which are also p-channel FET devices. The gate terminals of each device 116, 118 are respectively coupled to nodes Nt and Nc, while the drain terminals are respectively coupled to nodes Nc and Nt, which enables these devices 116, 118 to keep one of the nodes Nc and Nt high when the other node goes low. The two p-channel FET devices 120 and 122 respectively coupled between the voltage source VDD and the read data lines RDLt 98 and RDLc 100 also perform a similar latching function. That is, because the gate and drain terminals of the devices 120, 122 are also cross-coupled, this ensures that one of the read data lines RDLt or RDLc remains high when the other line goes low.

Still further, coupled between the nodes Nc and Nt and the respective drivers 90, 92 is associated intermediate driver stages 124 and 126. Each intermediate driver stage 124, 126 includes a p-channel FET device 124A, 126A which respectively supply additional current to more quickly turn on the drivers 90, 92. Each intermediate driver stage 124, 126 also includes an n-channel FET device 124B, 126B which respectively provides positive feedback to more quickly drive one of the nodes Nc and Nt to ground when one of these nodes begins to go low.

Also, respectively coupled between the gate terminals of the drivers 90, 92 and ground are additional n-channel FET devices 128 and 130. The gate terminals of these devices 128, 130 are coupled to an output of an inverter 132, whose input is coupled to the PC signal line. When the PC signal goes low, these devices 128, 130 are turned on which drives the gate terminals of the drivers 90, 92 to ground. This ensures that the drivers 90, 92 remain turned off while the read data lines RDLt 98 and RDLc 100 are pre-charged.

The two bias voltages Vn and Vp (also used in the embodiment of FIG. 6) may preferably be developed by the circuit designated by reference numeral 134. Further, the capacitors 136 respectively coupled between the external bit lines EBLt and EBLc and ground represent the capacitance of the external bit lines which is typically about 2.00 picofarads (pF) per line. The capacitors 138 respectively coupled to the read data lines RDLt and RDLc represent the capacitance of the read data lines which is typically about 4.00 to 10.00 pF per line.

While the invention has been particularly shown and described with reference to illustrative embodiments thereof, it will be understood by those skilled in the art that changes in form and details may be made therein without departing from the spirit and scope of the present invention.

What is claimed is:

1. A sensing system for sensing data from a data source and driving a pair of output lines in response thereto, the system comprising:

a primary sensing device operatively coupled to the data source for sensing and storing said data therein; and a secondary sensing device operatively coupled to the primary sensing device via a pair of input lines and also operatively coupled to the pair of output lines, the secondary sensing device being responsive to a differential voltage generated across the pair of input lines in accordance with said data stored by the primary sensing device and the secondary sensing device having a differential voltage threshold range associated therewith defined by a negative threshold and a positive threshold, whereby the secondary sensing device drives the pair of output lines to a first output condition when the differential voltage across the pair of input lines is within the differential voltage threshold range, to a second output condition when the differential voltage is at least equal to the negative threshold, and to a third output condition when the differential voltage is at least equal to the positive threshold the differential voltage threshold range for enabling self-timed operation of the secondary sensing device such that, upon reaching one of the thresholds, the secondary sensing device is set up for sensing data before adequate signal is present on the pair of input lines.

2. The sensing system of claim 1, wherein the first output condition is equivalent to a tri-state condition.

3. The sensing system of claim 1, wherein the second output condition is equivalent to one of a logic high signal level and a logic low signal level.

4. The sensing system of claim 1, wherein the third output condition is equivalent to one of a logic low signal level and a logic high signal level.

5. The sensing system of claim 1, wherein the primary sensing device and secondary sensing device are integrated with a semiconductor memory device wherein the data source is a memory cell and wherein the pair of input lines are external bit lines and the pair of output lines are read data lines.

6. A device coupled between a pair of input lines and a pair of output lines for driving the pair of output lines in response to a differential voltage across the pair of input lines, the device comprising:

a current source;

a differential amplifier having a pair of input terminals respectively operatively coupled to the input lines, a pair of output terminals respectively operatively coupled to the output lines, and another pair of terminals operatively coupled to the current source, the differential amplifier being responsive to the differential voltage across the pair of input lines and having a differential voltage threshold range associated therewith defined by a negative threshold and a positive threshold, the differential voltage threshold range for enabling self-timed operation of the differential amplifier such that, upon reaching one of the thresholds, the differential amplifier is set up for sensing data before adequate signal is present on the pair of input lines; and a driver for driving the pair of output lines, the driver being operatively coupled between the current source and the differential amplifier, wherein the driver drives the pair of output lines to a first output condition in response to the current source and the differential amplifier when the differential voltage across the input lines is within the differential voltage threshold range of the differential amplifier, wherein the driver drives the pair of output lines to a second output condition in response to the current source and the differential amplifier when the differential voltage across the input lines is at least equal to the negative threshold of the differential voltage threshold range, and wherein the driver drives the pair of output lines to a third output condition in response to the current source and the differential amplifier when the differential voltage across the input lines is at least equal to the positive threshold of the differential voltage threshold range.

7. The device of claim 6, wherein the negative and positive thresholds of the differential voltage range are substantially a function of a reference current associated with the current source and a current gain associated with the differential amplifier.

8. The device of claim 6, wherein the first output condition is equivalent to a tri-state condition.

9. The device of claim 6, wherein the second output condition is equivalent to one of a logic high signal level and a logic low signal level.

10. The device of claim 6, wherein the third output condition is equivalent to one of a logic low signal level and a logic high signal level.

11. The device of claim 6, wherein the differential amplifier includes a pair of differential amplifiers and the current source includes a pair of current sources respectively coupled to the pair of differential amplifiers.

12. The device of claim 11, wherein one of the pair of differential amplifiers conducts current which is substantially proportional to the differential voltage across the pair of input lines in order to cause the driver to drive the pair of output lines to the second output condition.

13. The device of claim 11, wherein another of the pair of differential amplifiers conducts current which is substantially proportional to the differential voltage across the pair of input lines in order to cause the driver means to drive the pair of output lines to the third output condition.

14. The device of claim 6, further comprising intermediate driver operatively coupled between the differential amplifier and the driver for expediting the driving of the pair of output lines to one of the second output condition and the third output condition.

15. The device of claim 6, further comprising a precharger for precharging the pair of input lines and the pair of output lines to a voltage source level in response to a precharge signal.

16. In a semiconductor memory device having a primary sense amplifier device for reading data from a memory cell and a secondary sense amplifier device coupled to the primary sense amplifier device through a pair of external bit lines such that the primary sense amplifier generates a differential voltage across the pair of external bit lines and wherein the secondary sense amplifier device is coupled between the pair of external bit lines and a pair of read data lines and drives the pair of read data lines in response to the differential voltage across the pair of external bit lines, the secondary sense amplifier device comprising:

a current source;

a differential amplifier having a pair of input terminals respectively operatively coupled to the external bit lines, a pair of output terminals respectively operatively coupled to the read data lines, and another pair of terminals operatively coupled to the current source, the differential amplifier being responsive to the differential voltage across the pair of external bit lines and having a differential voltage threshold range associated therewith defined by a negative threshold and a positive threshold, the differential voltage threshold range for enabling self-timed operation of the differential amplifier such that upon reaching one of the thresholds, the differential amplifier is set up for sensing data before adequate signal is present on the external bit lines; and driver for driving the pair of read data lines, the driver being operatively coupled between the current source and the differential amplifier, wherein the driver drives the pair of read data lines to a first output condition in response to the current source and the differential amplifier when the differential voltage across the external bit lines is within the differential voltage threshold range of the differential amplifier, wherein the driver drives the pair of read data lines to a second output condition in response to the current source and the differential amplifier when the differential voltage across the external bit lines is at least equal to the negative threshold of the differential voltage threshold range, and wherein the driver drives the pair of read data lines to a third output condition in response to the current source and the differential amplifier when the differential voltage across the external bit lines is at least equal to the positive threshold of the differential voltage threshold range.

17. The device of claim 16, wherein the negative and positive thresholds of the differential voltage range are substantially a function of a reference current associated with the current source and a current gain associated with the differential amplifier.

18. The device of claim 16, wherein the first output condition is equivalent to a tri-state condition.

19. The device of claim 16, wherein the second output condition is equivalent to one of a logic high signal level and a logic low signal level.

20. The device of claim 16, wherein the third output condition is equivalent to one of a logic low signal level and a logic high signal level.

21. The device of claim 16, wherein the differential amplifier includes a pair of differential amplifiers and the current source includes a pair of current sources respectively coupled to the pair of differential amplifiers.

22. The device of claim 21, wherein one of the pair of differential amplifiers conducts current which is substantially proportional to the differential voltage across the pair of external bit lines in order to cause the driver to drive the pair of read data lines to the second output condition.

23. The device of claim 21, wherein another of the pair of differential amplifiers conducts current which is substantially proportional to the differential voltage across the pair of external bit lines in order to cause the driver to drive the pair of read data lines to the third output condition.

24. The device of claim 16, further comprising intermediate driver operatively coupled between the differential amplifier and the driver for expediting the driving of the pair of read data lines to one of the second output condition and the third output condition.

25. The device of claim 16, further comprising a precharger for precharging the pair of external bit lines and the pair of read data lines to a voltage source level in response to a precharge signal.

* * * * *